(12) United States Patent
Chang (10) Patent No.: US 11,549,980 B2
(45) Date of Patent: Jan. 10, 2023

(54) OPEN ARCHITECTURE FOR WAFER AUTOMATIC TESTING SYSTEM

(71) Applicant: Chien Wen Chang, Taoyuan (TW)

(72) Inventor: Chien Wen Chang, Taoyuan (TW)

( * ) Notice: Subject to any disclaimer, the term of this patent is extended or adjusted under 35 U.S.C. 154(b) by 0 days.

(21) Appl. No.: 17/475,495

(22) Filed: Sep. 15, 2021

(65) Prior Publication Data

US 2022/0091183 A1    Mar. 24, 2022

(30) Foreign Application Priority Data

Sep. 18, 2020   (TW) .................................. 109132238

(51) Int. Cl.
| | |
|---|---|
| *G01R 31/00* | (2006.01) |
| *G01R 31/28* | (2006.01) |
| *G01R 1/04* | (2006.01) |
| *G01R 1/067* | (2006.01) |
| *G01R 1/073* | (2006.01) |

(52) U.S. Cl.
CPC ..... *G01R 31/2887* (2013.01); *G01R 31/2889* (2013.01)

(58) Field of Classification Search
CPC ........ G01R 31/00; G01R 31/02; G01R 31/28; G01R 1/04; G01R 1/06; G01R 1/067; G01R 1/073
See application file for complete search history.

(56) References Cited

U.S. PATENT DOCUMENTS

2010/0079161 A1*  4/2010  Endo .................. G01R 31/2887
                                                              324/754.12

* cited by examiner

*Primary Examiner* — Neel D Shah (57) ABSTRACT

An open architecture for a wafer automatic testing system of one embodiment includes a wafer auto prober including a lifter and a fixture frame; a pogo-pin interface module mounted on the fixture frame; and at least one instrument chassis mounted on the fixture frame and above the pogo-pin interface module. The at least one instrument chassis is electrically connected to the pogo-pin interface module.

10 Claims, 11 Drawing Sheets

OPEN ARCHITECTURE FOR WAFER AUTOMATIC TESTING SYSTEM

BACKGROUND OF THE INVENTION

1. Field of the Invention

The invention relates to wafer automatic testing systems and more particularly to an open architecture for a wafer automatic testing system in which a pogo-pin interface module and instrument chassis are provided above a wafer auto prober by means of a fixture frame. It is an open assembly and is possible of quickly constructing a cabinet-less wafer automatic testing system. It can increase the speed of research and development (R&D) of the wafer automatic testing system, decrease the R&D cost, decrease the space occupied by the wafer automatic testing system, and increase space utilization rate of the factory.

2. Description of Related Art

The number of components of a circuit increases significantly as semiconductor technology and optoelectronics advance. In the field of component parameters or reliability tests of the semiconductor technology and optoelectronics, a lot of test data is required for precise analysis. Thus, more wafer automatic testing systems are required to increase testing productivity. However, space of a production line in a factory or space of a laboratory is limited and it is not always feasible to accommodate space requirements again and again. Therefore, how to increase the test performance per unit time in consideration of the limited space is an issue to be addressed.

Figure 13:
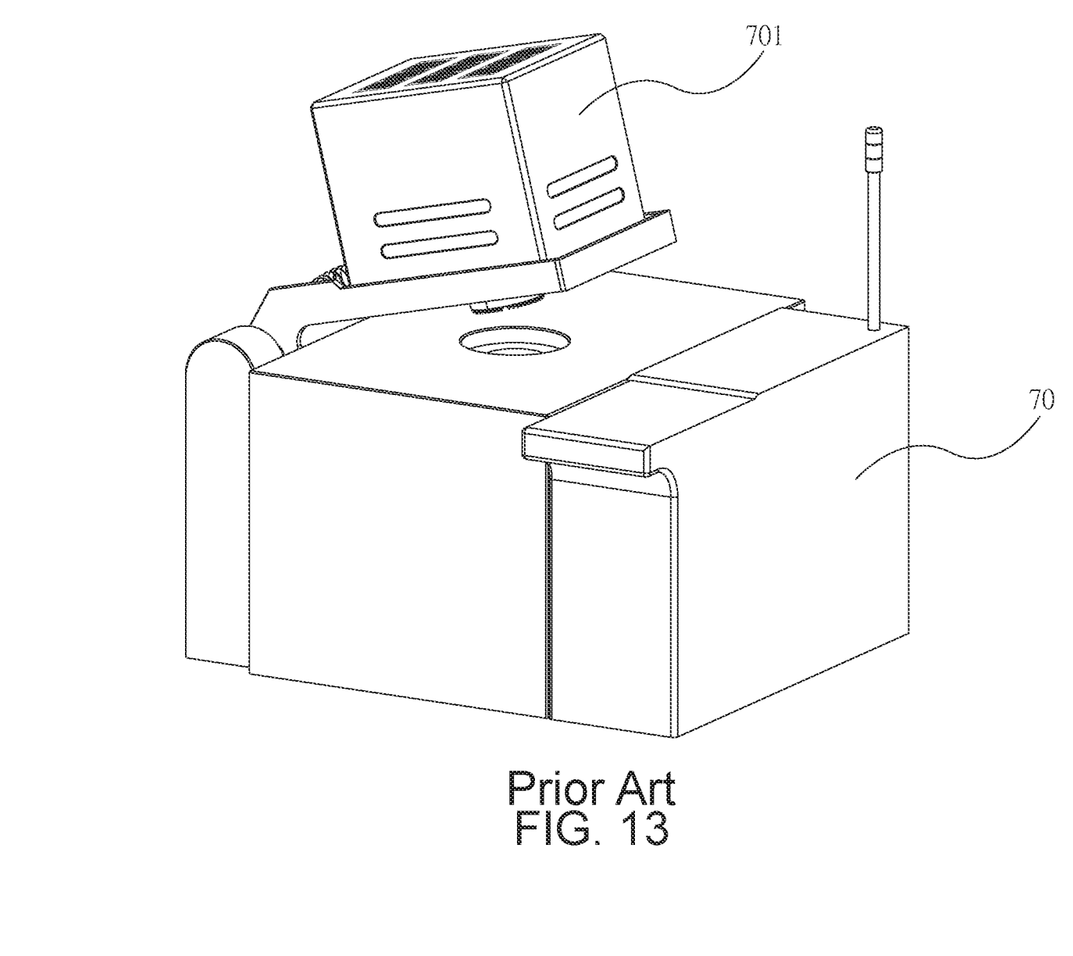
FIG. 13 is a perspective view of a conventional closed test head solution.

A first conventional wafer automatic testing system is shown in FIG. 13 and is implemented as a closed test head solution which puts all hardware resources in a closed test head enclosure 701 which is in turn disposed above a wafer auto prober 70. However, the hardware resources of the closed test head solution are typically proprietary hardware of an original company. Thus, it is a closed system and further limited by the test head enclosure 701. And in turn, the closed test head solution is not capable of expansion and upgrading. Moreover, its manufacturing cost and retail price are very high. Furthermore, a powerful cooling fan is required to dissipate heat from hardware inside the closed test head enclosure 701 because high density of hardware devices are enclosed in the closed test head enclosure 701. However, the installation of a powerful cooling fan can generate strong vibration and noise and consume great energy. To the worse, complex and expensive water-cooling solution may be required and they may cause more problems and inconvenience.

Figure 14:
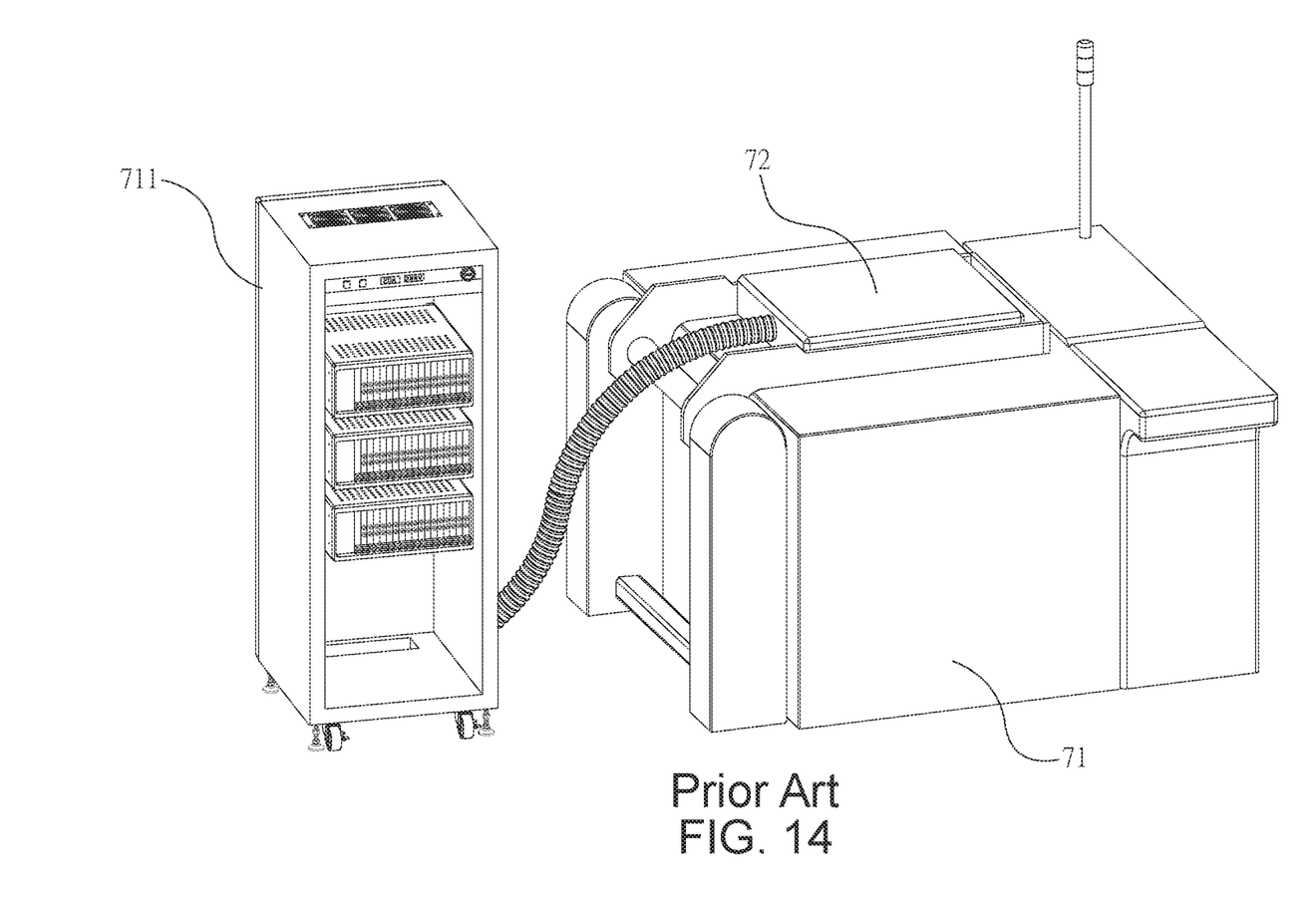
FIG. 14 is a perspective view of a conventional instrument cabinet solution.

A second conventional wafer automatic testing solution is shown in FIG. 14 and implemented as an instrument cabinet solution. A wider variety of instruments are installed in an instrument cabinet 711 and they are electrically connected to a pogo-pin interface 72 on top of a wafer auto prober 71. The instrument cabinet solution is capable of expansion and upgrading. Moreover, adjustment, maintenance and repair of the instruments are easy due to its open architecture. However, the instrument cabinet 711 is bulky and long cables are required. For example, the typical length of cable may be 4-5 meters for electrically connection. Unfortunately, such lengthy cabling degrades instrument performance and impacts many applications. While minimized and modularized instruments, such as PXI modularized instruments, are available to deploy more instrument hardware in the instrument cabinet 711 for saving space, the problem of requiring long cables to electrically connect to a wafer to be tested is still unsolved.

Thus, the need for improvement still exists.

SUMMARY OF THE INVENTION

It is therefore a first object of the invention to provide an open architecture for a wafer automatic testing system comprising a wafer auto prober including a lifter and a fixture frame; a pogo-pin interface module mounted on the fixture frame; and at least one instrument chassis mounted on the fixture frame and above the pogo-pin interface module, the at least one instrument chassis being electrically connected to the pogo-pin interface module.

A second object of the invention is to provide an open architecture for a wafer automatic testing system comprising a wafer auto prober including a lifter and a fixture frame; a support device including a space on a bottom and a support member above the space, the support device being disposed on the fixture frame; a pogo-pin interface module mounted in the space of the support device; and at least one instrument chassis disposed on a top of the support member, the at least one instrument chassis being electrically connected to the pogo-pin interface module.

The invention has the following advantages and benefits in comparison with the conventional art: With the above flexible assembly, the commercially available test equipment can be used to quickly construct a wafer automatic testing system. The requirement of developing customized hardware is decreased. The R&D mode of the conventional wafer automatic testing system is discarded. Time and cost for developing wafer automatic testing system can be drastically reduced. It is easy to construct a cabinet-less wafer automatic testing system. Space occupied by the wafer automatic testing system is decreased. Space utilization rate is increased. The instrument chassis being allocated in the proximity of the pogo-pin interface module greatly decreases length of cable. Performance of the test equipment is increased.

Regarding users of the automatic testing system, the open architecture for the wafer automatic testing system is greatly flexible in expansion and upgrading. Most new testing requirements are supported by simply adjusting or replacing some components without replacing the whole automatic testing system. The commercially available test equipment is utilized and is completely not limited by the specific hardware components produced by the original company of the wafer automatic testing system. A new development field of wafer automatic testing has come true with more creativity and many economic benefits brought about.

In addition to above advantages, not all test hardware devices are enclosed in a closed test head enclosure according to the open architecture for the wafer automatic testing system of the invention. The R&D cost of the test head enclosure is removed. There is no limitation caused by the test head enclosure anymore. It is easy for hardware repair, maintenance, upgrading and expansion. The open architecture has an increased heat dissipation capability. Additional noisy fans for heat dissipation purposes are not required. Thus, power energy is saved, generated vibration and noise are greatly decreased, electromagnetic interference (EMI) is greatly decreased, and a more precise measurement of the wafer is made possible.

The above and other objects, features and advantages of the invention will become apparent from the following detailed description taken with the accompanying drawings.

DETAILED DESCRIPTION OF THE INVENTION

Figure 1:
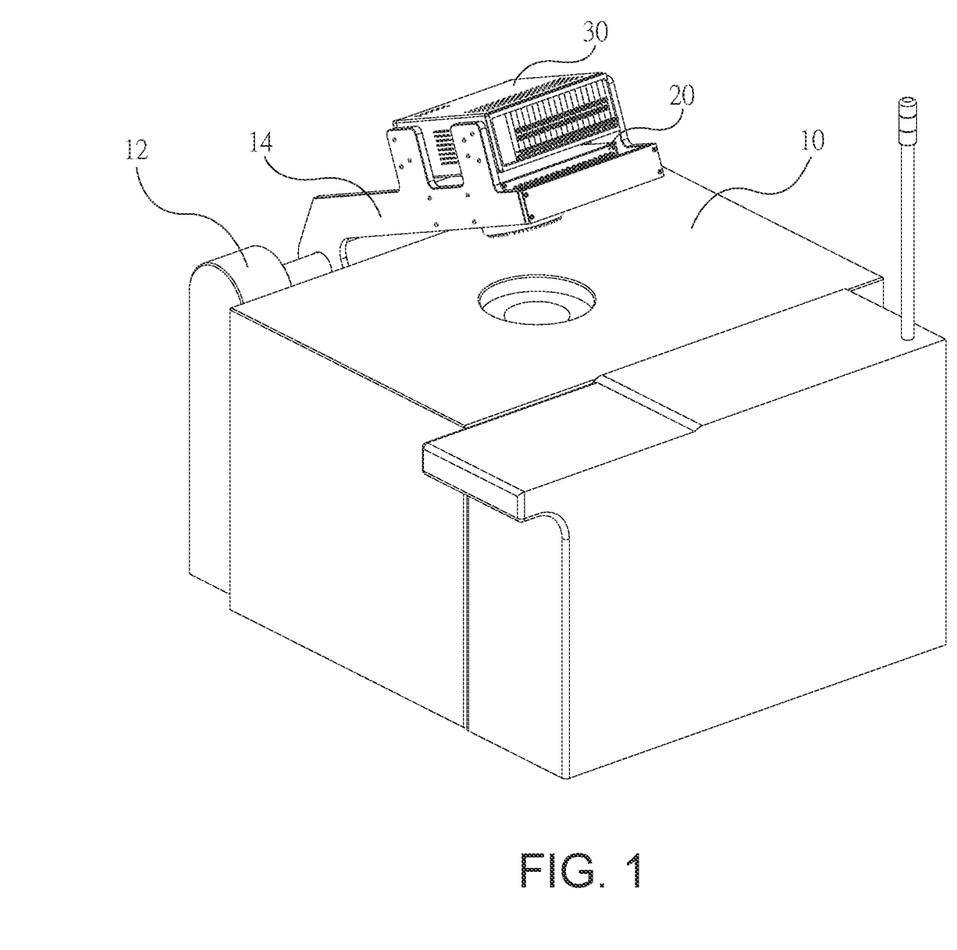
FIG. 1 is a perspective view of an open architecture for a wafer automatic testing system according to a first preferred embodiment of the invention.

Referring to FIG. 1, an open architecture for a wafer automatic testing system in accordance with a first preferred embodiment of the invention is shown and comprises a wafer auto prober 10, a pogo-pin interface module 20 and at least one instrument chassis 30. The wafer auto prober 10 includes a lifter 12 and a fixture frame 14. The pogo-pin interface module 20 is mounted on the fixture frame 14. The instrument chassis 30 is also mounted on the fixture frame 14 and above the pogo-pin interface module 20. The instrument chassis 30 is electrically connected to the pogo-pin interface module 20 to form a cabinet-less wafer automatic testing system. That is, there is no need of installing a bulky instrument cabinet besides the wafer auto prober 10, thereby saving a precious space of a testing production line or laboratory. Further, it can significantly decrease length of cables because the instrument chassis 30 is in close proximity to the pogo-pin interface module 20. It is known that attenuation can be occurred if the length of the cable is excessively long. Thus, the invention can increase performance of the wafer automatic testing system by reducing cable length.

Figure 2:
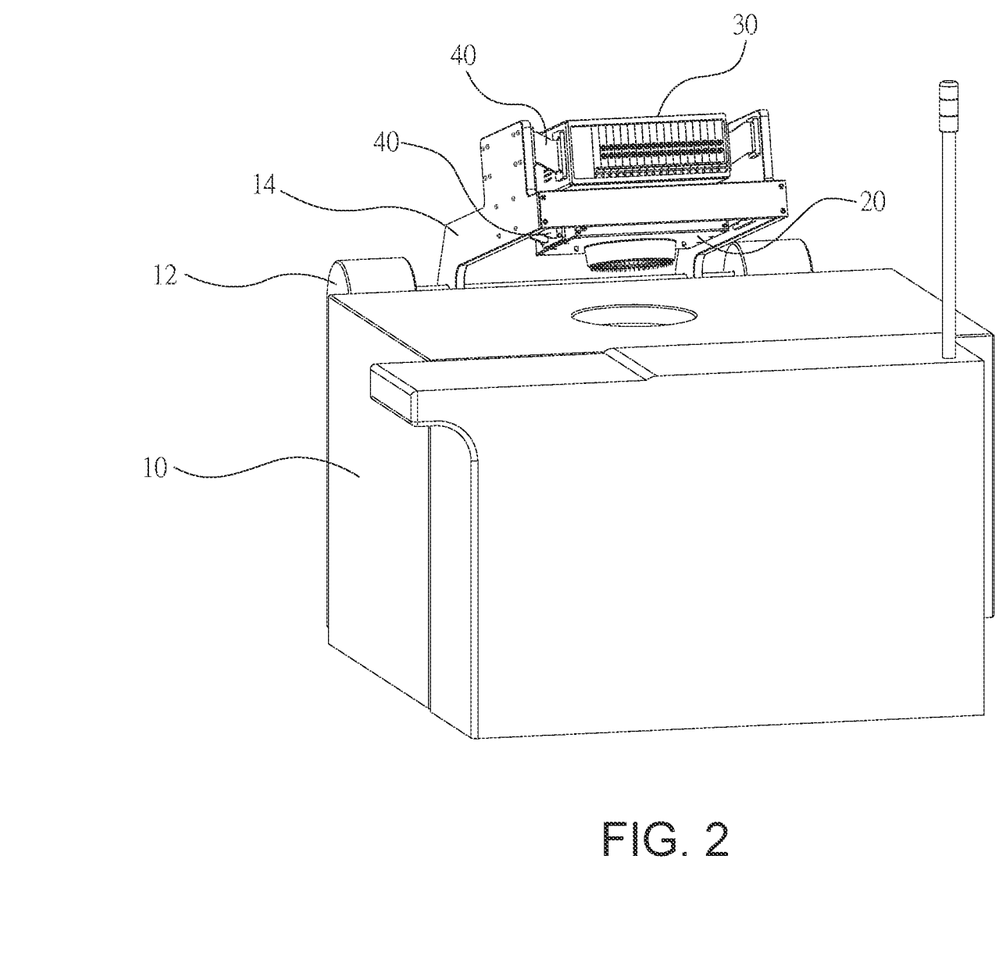
FIG. 2 is a perspective view of an open architecture for a wafer automatic testing system according to a second preferred embodiment of the invention, the open architecture using adaptor brackets.
Figure 3:
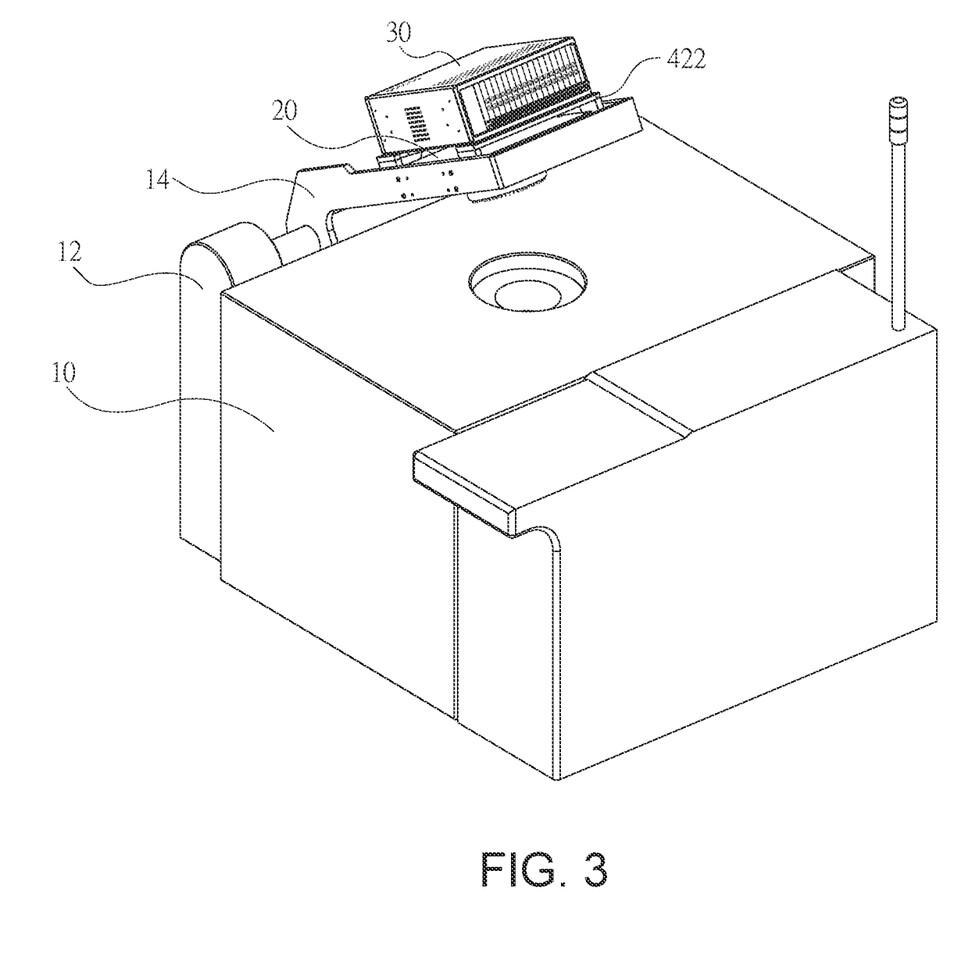
FIG. 3 is a perspective view of an open architecture for a wafer automatic testing system according to a third preferred embodiment of the invention, the open architecture using a support device.
Figure 4:
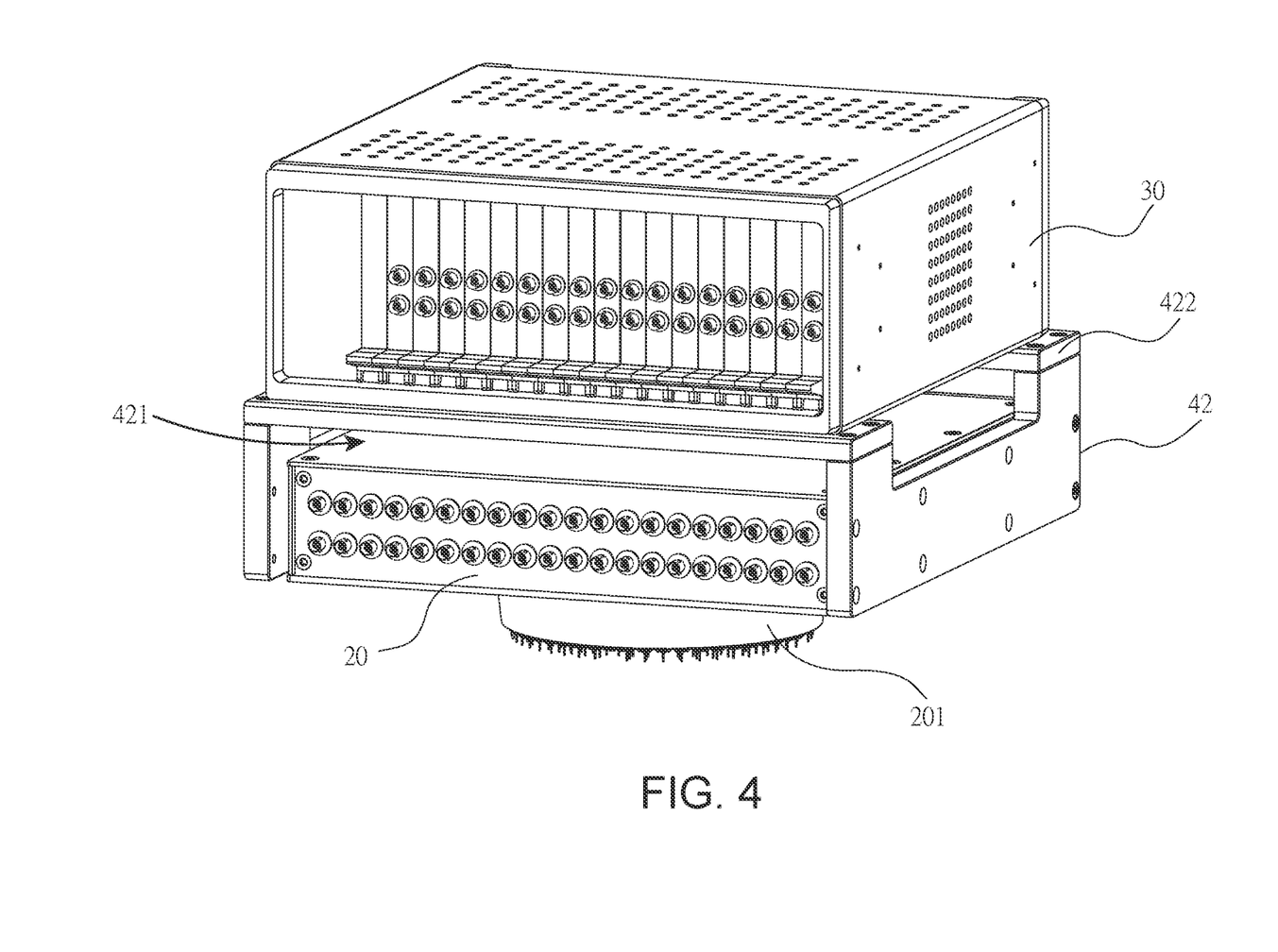
FIG. 4 is a perspective view of an instrument chassis and a pogo-pin interface module mounted on the support device.
Figure 5:
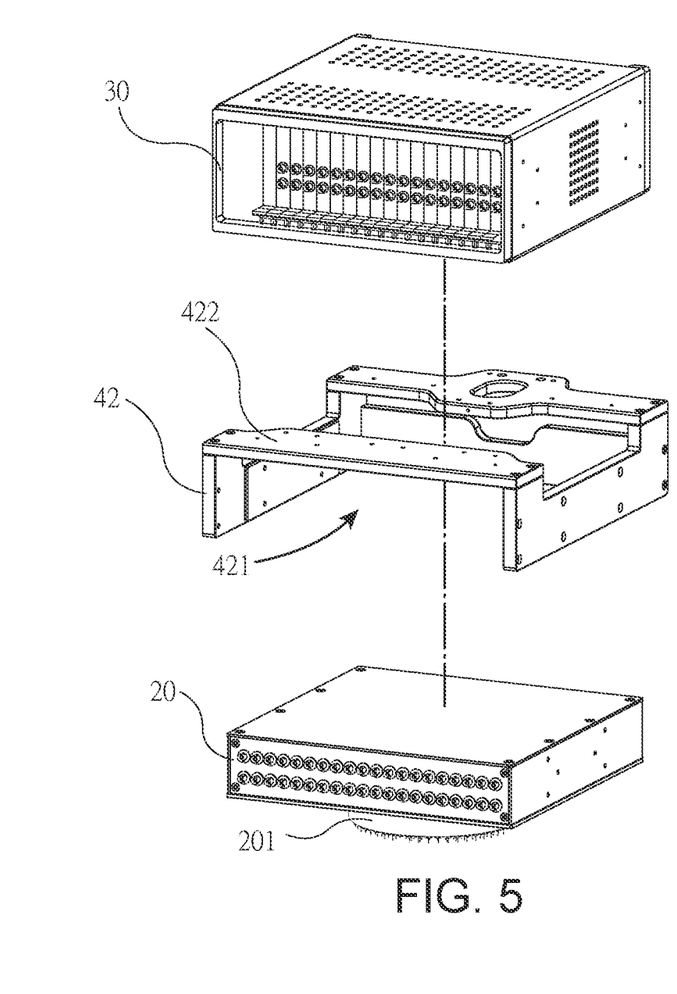
FIG. 5 is an exploded view of FIG. 4.

Referring to FIG. 2, an open architecture for a wafer automatic testing system in accordance with a second preferred embodiment of the invention is shown. The characteristics of the second preferred embodiment are detailed below. If size of the pogo-pin interface module 20 or the instrument chassis 30 does not well match that of the wafer auto prober 10, at least one adaptor bracket 40 is provided in each of the pogo-pin interface module 20 and the instrument chassis 30. Further, each adaptor bracket 40 is connected to the fixture frame 14 of the wafer auto prober 10 for fastening and combining purposes. Furthermore, it is possible of increasing space between the instrument chassis 30 and the fixture frame 14 for better dissipating heat therefrom, and increasing stability with longer useful life of the instrument chassis 30 by means of applying the adaptor brackets 40.

Referring to FIGS. 3 to 6, an open architecture for a wafer automatic testing system in accordance with a third preferred embodiment of the invention is shown. The characteristics of the third preferred embodiment are detailed below. The open architecture for the wafer automatic testing system comprises a wafer auto prober 10, a support device 42, a pogo-pin interface module 20 and at least one instrument chassis 30. The wafer auto prober 10 includes a lifter 12 and a fixture frame 14. Bottom of the support device 42 is provided with a space 421 and a support member 422 is provided on upward projecting pillars (not numbered) of the support device 42 (i.e., above the space 421). The support device 42 is mounted on the fixture frame 14. With the support device 42 as a base, the pogo-pin interface module 20 is provided in the space 421, the instrument chassis 30 is horizontally disposed on a top of the support member 422, and the instrument chassis 30 is electrically connected to the pogo-pin interface module 20 via cables (not shown), an assembly of the open architecture for the wafer automatic testing system is finished.

The open architecture of the wafer automatic testing system is designed and constructed without the conventional closed test head enclosure which houses all of testing hardware inside. Thus, there is no need of providing a closed test head enclosure or solving the problem of heat accumulation in the closed test head enclosure. As a result, the R&D cost is decreased greatly and a practical new style of wafer automatic testing solution can be devised quickly.

By utilizing the open architecture for the wafer automatic testing system of the invention, it is possible of disposing the instrument chassis 30 in close proximity to the pogo-pin interface module 20, greatly decreasing the length of the cable between the instrument chassis 30 and the pogo-pin interface module 20, increasing performance of the wafer automatic testing system, and decreasing the cost of cable as well. It is possible of adjusting sizes of both the adaptor bracket 40 and the support device 42 based on applications because the invention is implemented as an open test head architecture. As an end, an optimum distance between the instrument chassis 30 and the pogo-pin interface module 20 can be achieved, and better heat dissipation conditions can be obtained. Further, the open architecture of the invention makes disassembly of both the pogo-pin interface module 20 and the instrument chassis 30 easy, thereby facilitating system hardware repair, maintenance, upgrading and replacement.

Figure 6:
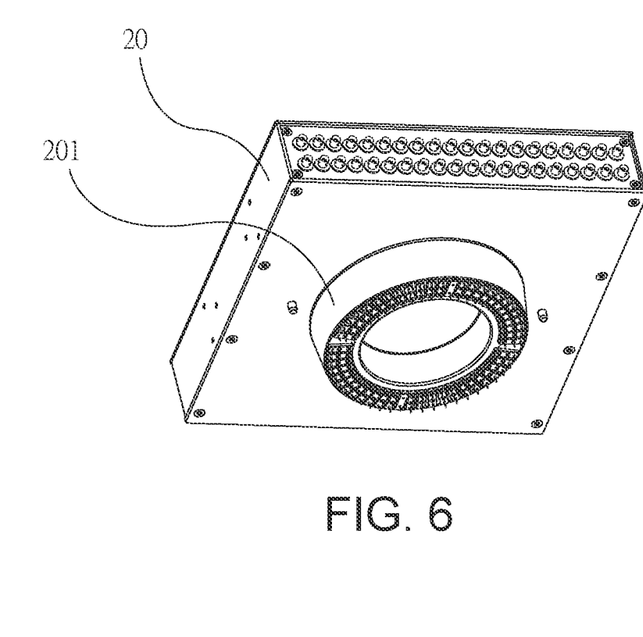
FIG. 6 is another perspective view of the pogo-pin interface module of FIG. 5.
Figure 7:
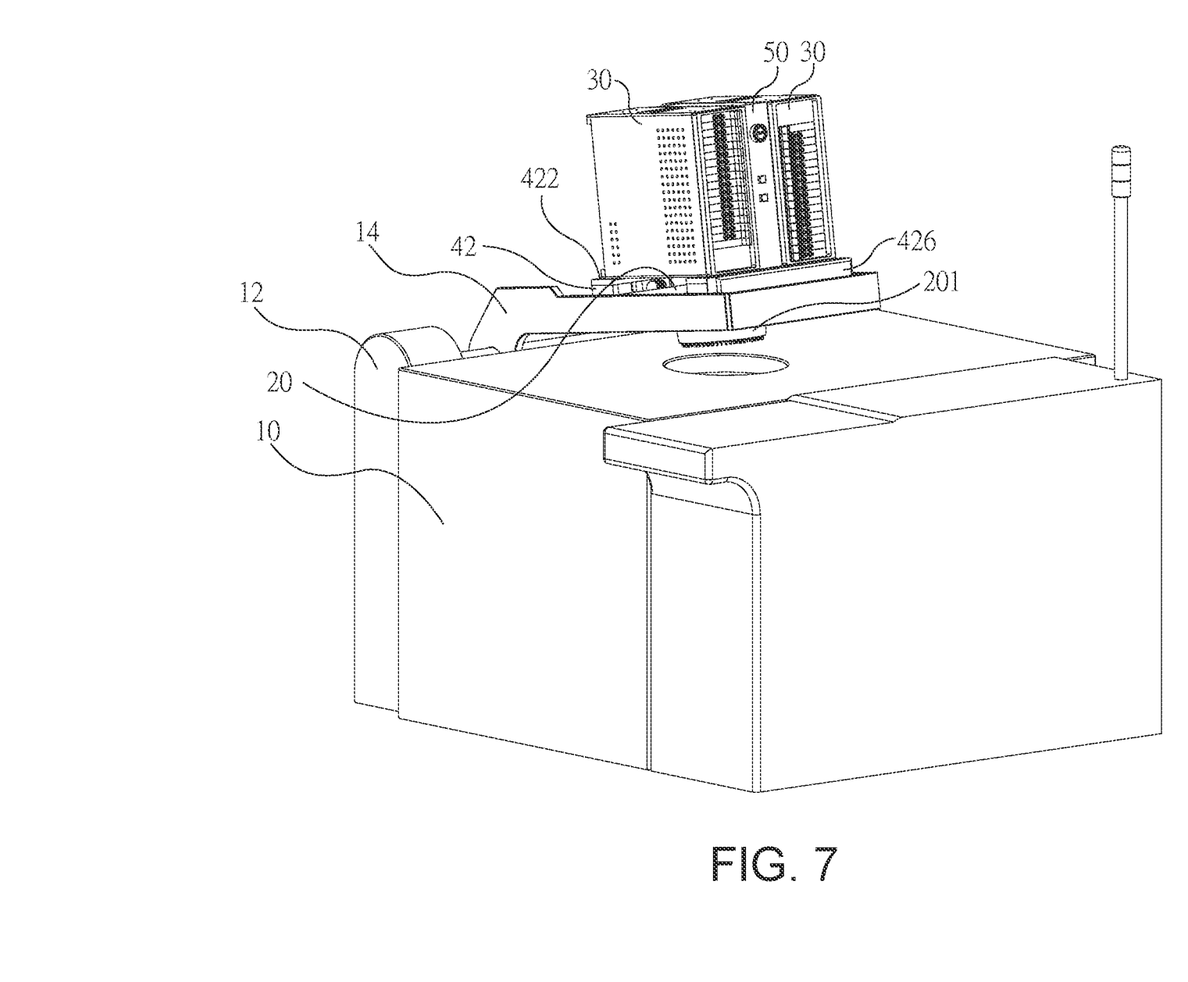
FIG. 7 is a perspective view of an open architecture for a wafer automatic testing system according to a fourth preferred embodiment of the invention.
Figure 8:
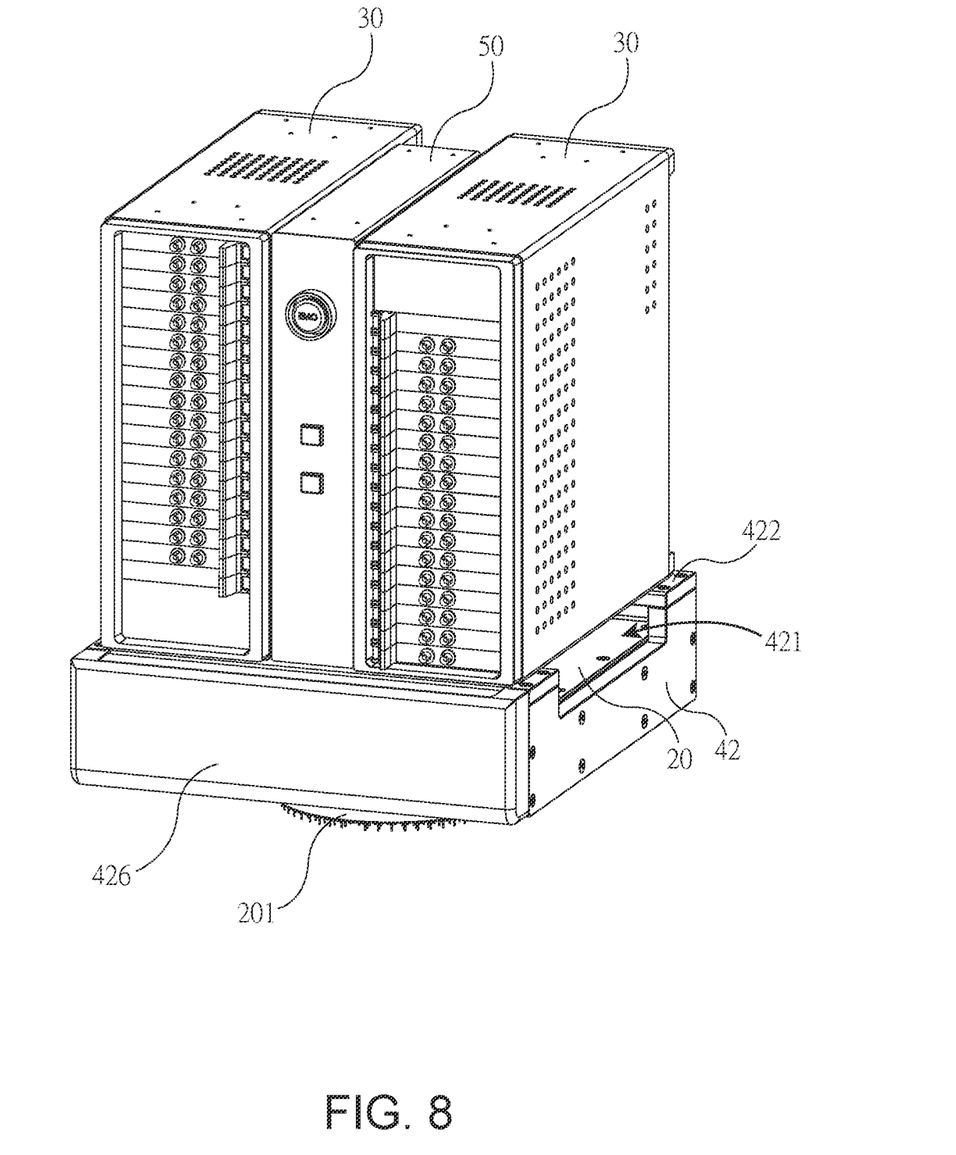
FIG. 8 is a perspective view of two instrument chassis with a power distribution unit chassis mounted on the support device.

As shown in FIG. 6 specifically, a pogo-pin tower 201 is integrally provided on a bottom of the pogo-pin interface module 20 or assembled onto the bottom of the pogo-pin interface module 20. It is easy to disassemble or adjust the orientation of the pogo-pin tower 201 if the pogo-pin tower 201 is assembled onto the bottom of the pogo-pin interface module 20.

Referring to FIGS. 7 to 10, an open architecture for a wafer automatic testing system in accordance with a fourth preferred embodiment of the invention is shown. The characteristics of the fourth preferred embodiment are detailed below. A plurality of instrument chassis 30 (two are shown) and at least one power distribution unit chassis 50 are provided. The instrument chassis 30 are vertically secured onto the support device 42. The power distribution unit chassis 50 is provided between the instrument chassis 30. The instrument chassis 30 are electrically connected to the power distribution unit chassis 50. The provision of the power distribution unit chassis 50 increases electrical safety of the open architecture for the wafer automatic testing system, and complies with factory safety requirements.

Regarding the above description, the number of the instrument chassis 30 are not limited to two and the number of the power distribution unit chassis 50 is also not limited to one. A user may increase the numbers of both the instrument chassis 30 and the power distribution unit chassis 50 based on applications.

Figure 9:
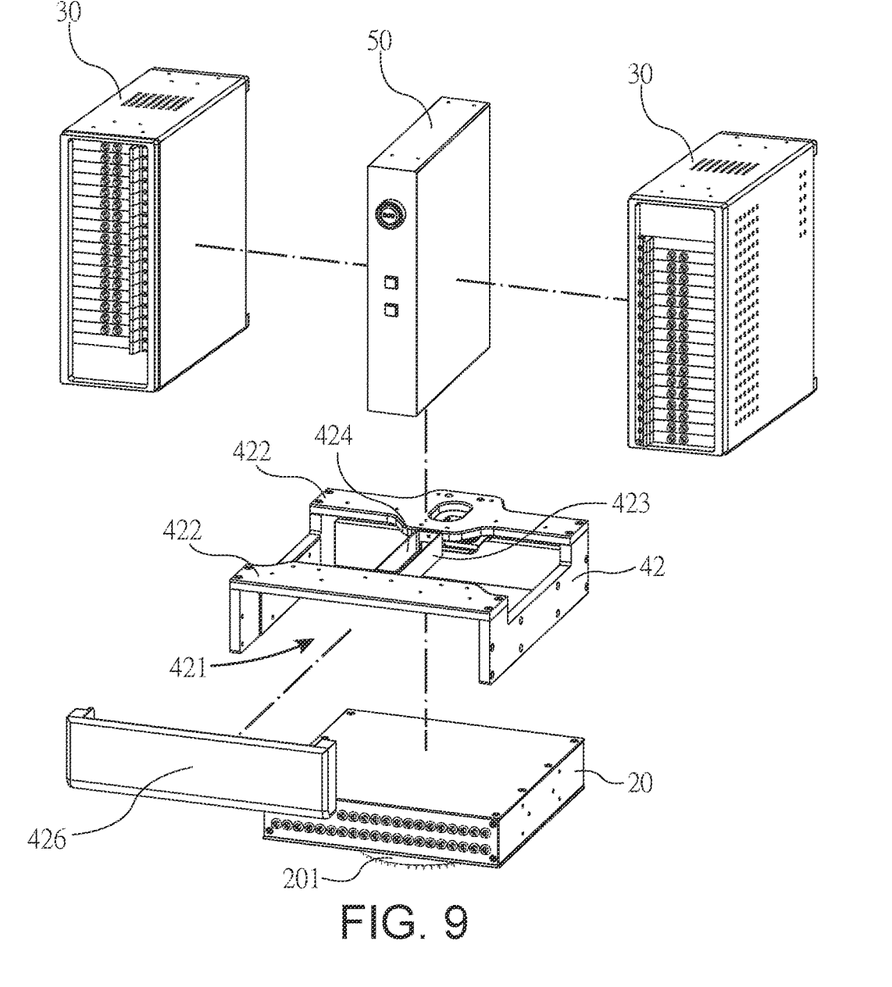
FIG. 9 is an exploded view of FIG. 8.
Figure 10:
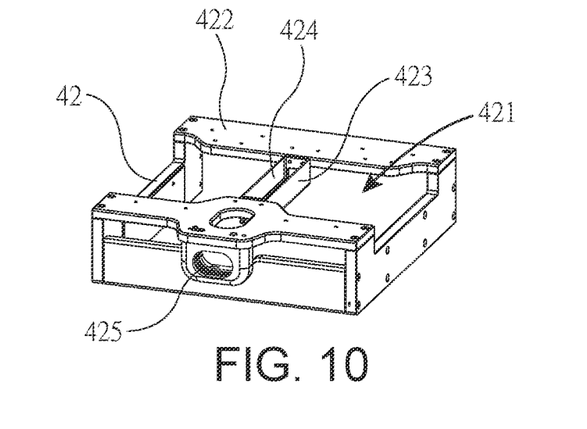
FIG. 10 is another perspective view of the support device of FIG. 9.

As shown in FIGS. 9 and 10 specifically, a dividing member 423 is provided in the space 421 of the support device 42, a cable slot 424 is provided in the dividing member 423, a cable tube clamp 425 is provided at a rear end of the support device 42, and a baffle plate 426 is provided at a front end of the support device 42. The position and size of the baffle plate 426 can be changed as long as it does not hinder heat dissipation and repairmen and maintenance. Some cables are routed to go through the cable slot 424 and then pass through a cable tube (not shown) fastened by the cable tube clamp 425 with irregular displacement being avoided. Otherwise, the cables may be messy or disengaged. This better cabling can increase system safety and reliability. The baffle plate 426 can decrease possibility of exposing the cables, thereby increasing aesthetic appearance of the system and decreasing vibration of the cables.

Figure 11:
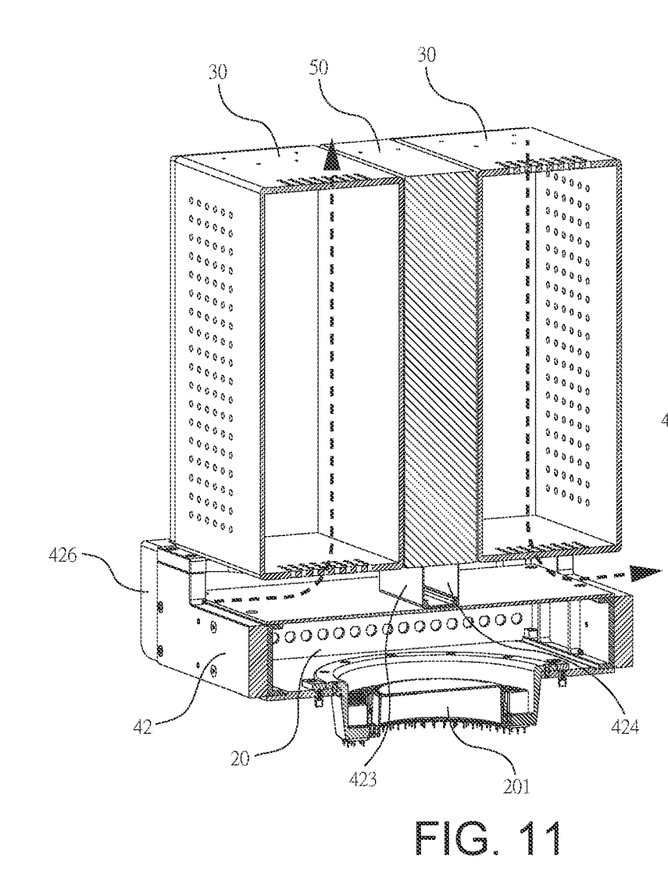
FIG. 11 is a perspective view showing vertical air flows for dissipating heat from the instrument chassis.

Referring to FIG. 11, it shows vertical air flows for dissipating heat from two instrument chassis 30 in which heat flows downward from one instrument chassis 30 for dissipation and heat flows upward from the other instrument chassis 30 for dissipation. While in such practice, the provision of the dividing member 423 on the bottom of the support device 42 can prevent exhausted heat recycling between the proximate instrument chassis 30, otherwise, adversely affecting heat dissipation may be brought about by the short looping of hot air.

Figure 12:
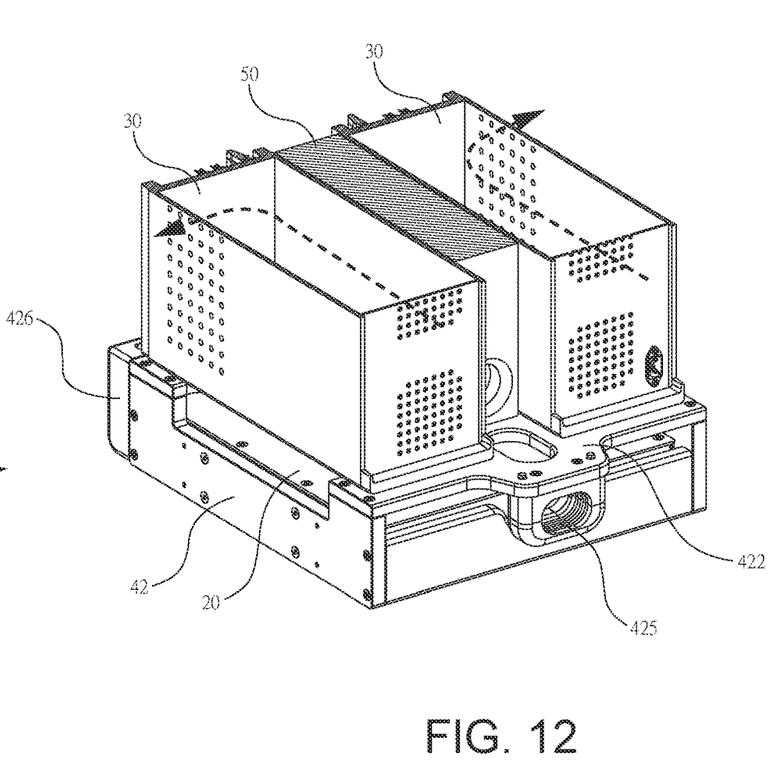
FIG. 12 is a perspective view showing horizontal air flows for dissipating heat from the instrument chassis.

Referring to FIG. 12, it shows horizontal air flows for dissipating heat from the instrument chassis 30. Specifically, heat dissipates from holes on one side of each instrument chassis 30 without obstacle to hot air exhausting.

It is understood that an orientation of the instrument chassis 30 can be changed to an inclined orientation or a specific orientation other than the above example of vertical or horizontal orientation depending on actual heat dissipation requirements or other consideration for applications.

As mentioned previously, the invention eliminates disadvantages and solves many problems associated with the conventional art and has many advantages and benefits in comparison with the conventional art.

While the invention has been described in terms of preferred embodiments, those skilled in the art will recognize that the invention can be practiced with modifications within the spirit and scope of the appended claims.

What is claimed is:

1. An open architecture for a wafer automatic testing system, comprising:
   a wafer auto prober including a lifter and a fixture frame;
   a pogo-pin interface module disposed on the fixture frame; and
   at least one instrument chassis disposed on the fixture frame and above the pogo-pin interface module, the at least one instrument chassis being electrically connected to the pogo-pin interface module,
   wherein the at least one instrument chassis and the pogo-pin interface module are separately disposed on the fixture frame, and the at least one instrument chassis does not bear the weight of the pogo-pin interface module.

2. The open architecture of claim 1, wherein the pogo-pin interface module and the at least one instrument chassis each include at least one adaptor bracket connected to the fixture frame.

3. An open architecture for a wafer automatic testing system, comprising:
   a wafer auto prober including a lifter and a fixture frame;
   a support device including a space on a bottom and a support member above the space, the support device being disposed on the fixture frame;
   a pogo-pin interface module disposed in the space of the support device; and
   at least one instrument chassis disposed on a top of the support member, the at least one instrument chassis being electrically connected to the pogo-pin interface module.

4. The open architecture of claim 3, further comprising a plurality of instrument chassis and at least one power distribution unit chassis on the support member, the instrument chassis being electrically connected to the at least one power distribution unit chassis.

5. The open architecture of claim 3, further comprising a dividing member in the space of the support device.

6. The open architecture of claim 5, further comprising a cable slot in the dividing member.

7. The open architecture of claim 3, further comprising a cable tube clamp at a rear end of the support device.

8. The open architecture of claim 3, further comprising a baffle plate at a front end of the support device.

9. The open architecture of claim 3, further comprising a pogo-pin tower integrally disposed on a bottom of the pogo-pin interface module or assembled onto the bottom of the pogo-pin interface module.

10. The open architecture of claim 3, wherein an orientation of the at least one instrument chassis is horizontal, vertical, inclined or a predetermined direction other than the horizontal, vertical, and the inclined orientations.

\* \* \* \* \*